United States Patent [19]

Vinal

[11] 4,048,648

[45] Sept. 13, 1977

[54] HIGH CARRIER VELOCITY FET MAGNETIC SENSOR

[75] Inventor: Albert Watson Vinal, Cary, N.C.

[73] Assignee: International Business Machines Corporation, Armonk, N.Y.

[21] Appl. No.: 701,339

[22] Filed: June 30, 1976

[51] Int. Cl.$^2$ .................... H01L 27/22; H01L 29/82; H01L 29/96
[52] U.S. Cl. ...................... 357/27; 357/23; 357/58; 357/91; 307/304; 307/309
[58] Field of Search ............ 357/23, 27, 58, 91; 307/304, 309

[56] References Cited

U.S. PATENT DOCUMENTS

| 3,448,353 | 6/1969 | Gallagher et al. | 357/27 |
| 3,829,883 | 8/1974 | Bate | 357/27 |
| 3,836,993 | 9/1974 | Joshi | 357/27 |

FOREIGN PATENT DOCUMENTS

| 1,243,178 | 8/1971 | United Kingdom | 357/27 |

OTHER PUBLICATIONS

*Channel Method for Detection of Magnetic Field*, by Rekalova, Sov. Phys. Semiconductor, vol. 10, No. 2, Feb. 1976.
*Fet. Hall Transducer with Control Gates*, by Brown, IBM Technical Disclosure Bulletin, vol. 17, No. 7, Dec. 1974, pp. 1895-1896.
*Micro-Electronic Magnetic Transducers*, by Hollis, Measurement and Control, vol. 6, No. 1, Jan. 1973, pp. 38-40.
*Japanese Journal of Applied Physics*; by Vagi et al., vol. 15, No. 4, Apr. 1976, pp. 655-661.

Primary Examiner—Andrew J. James
Attorney, Agent, or Firm—Edward H. Duffield

[57] ABSTRACT

A FET structure for a magnetic field sensor which operates by achieving very high carrier velocities in the active region of the sensor is disclosed. A Hall output voltage is produced by the sensor in response to a magnetic flux field passing therethrough and, due to the high carrier velocities achieved, a very high sensitivity device is obtained by operating the FET structure in the pinch off mode or depletion mode. The position of the pinched off area of the conductive channel is varied to position the location of maximum carrier velocity in the channel at a desired point relative to an output probe. This position is controlled by the use of a control gate.

9 Claims, 17 Drawing Figures

FIG. 10
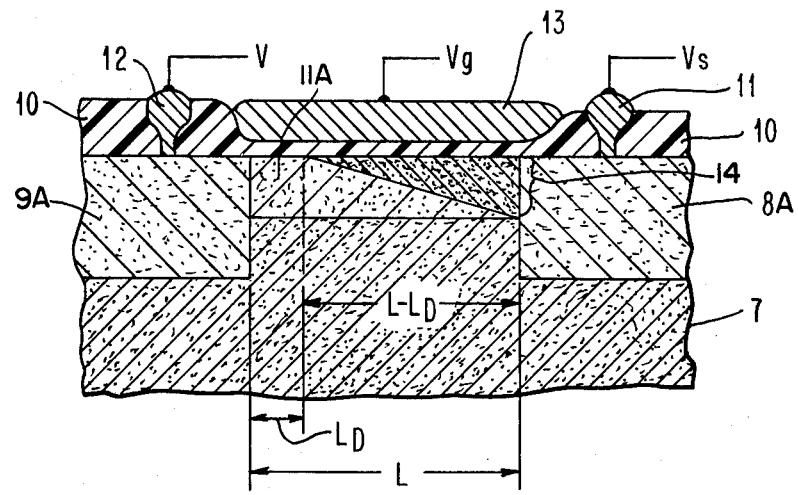
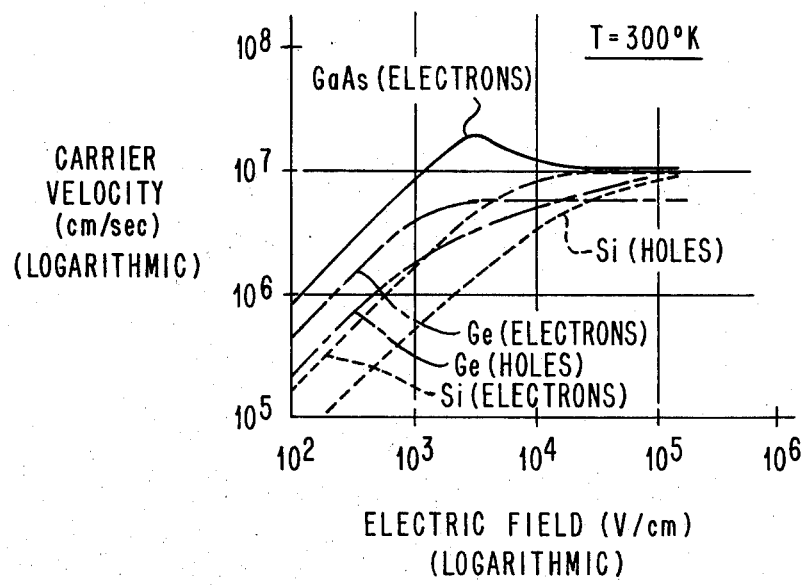
FIG. 11

MAXIMUM SENSOR OUTPUT (MV)/K
GAUSS vs CONTOUR WIDTH (W)
STRUCTURE W/L = 1.0

HIGH CARRIER VELOCITY FET MAGNETIC SENSOR

FIELD OF THE INVENTION

This invention relates to magnetic flux sensors in general and to the semiconductive Hall voltage types of sensors in particular, and more specifically to field effect transistors and their structures adapted as magnetic flux sensors.

PRIOR ART

The prior art is replete with examples of the so-called Hall effect magnetic sensor devices. In particular, field effect transistor structures producing Hall voltages are well known as evidenced by U.S. Pat. Nos. 3,714,523, 3,683,242, 3,003,105, 3,035,183, 3,849,875, 3,916,428, and 3,667,000, for example. Also, a good deal of technical literature has been produced on the subject, for example, see IEEE Transactions on Electron Devices, entitled "A Silicon MOS Magnetic Field Transducer of High Sensitivity" by Frey, et al, Vol. 16, January 1969, pages 35–39 and the IBM Technical Disclosure Bulletin, entitled "Hall Effect Device Feedback Circuit" by Collins, Vol. 13, No. 8, January 1971, page 2448, and the IBM Technical Disclosure Bulletin, entitled "Magnetic Switch or Magnetometer" by Fang, et al, Vol. 11, No. 6, November 1968, pages 637–638.

In the prior art noted above, it may be generally stated that the sensitivity of the sensors has been the subject of much investigation and development work. An approach commonly taken to produce a high sensitivity device is to select semiconductive materials for constructing the device which have an intrinsically high so-called "Hall Mobility".

The aforementioned prior art devices and the approaches to solving the sensitivity problems taken therein have generally resulted in some success, but with output sensitivities generally falling well below those predicted as the maximum obtainable Hall voltage output values per kilogauss of applied magnetic field. The better examples of a prior art have attained output voltages as high as 20 millivolts per kilogauss of applied magnetic field and it has previously been generally accepted that the theoretical maximum obtainable output would be on the order of 40 millivolts per kilogauss.

It has unexpectedly been discovered that, by operating a semiconductive device of appropriate resistance under an appropriately high lateral electrical field, that the carrier velocities of the electrons or holes in the device may be driven to their saturation velocity values and that this can result in output sensitivities, measured in millivolts per kilogauss of an applied magnetic field, which are one to two orders of magnitude higher than the best known prior art. See my co-pending application, Ser. No. 577,254 now U.S. Pat. No. 3,997,909, in which this basic teaching has been detailed. As discussed in my co-pending application, sensitivities on the order of one to two volts per kilogauss can be obtained for a lateral electrical field across the body of the sensor of at least 500 volts per centimeter where the resistance of the body itself is on the other of at least 500 ohms per square. Such a device, when operated under the prescribed conditions, can be made of any semiconductive material, insofar as is known, without regard to the so-called "Hall Mobility" intrinsic to the material chosen.

OBJECTS OF THE INVENTION

In light of the general lack of high sensitivity achieved in the prior art devices, with the exception of my aforementioned co-pending application, it is an object of this invention to provide an improved magnetic sensor structure in which lateral electrical fields of at least 500 volts per centimeter may be obtained in a body having a resistance of at least 500 ohms per square. In such a device, carrier velocities at or near those maximum velocities obtainable in a semiconductor device may be produced with the resulting high level Hall output occasioned thereby when magnetic flux fields intersect the high velocity stream of carriers.

A further object of this invention is to provide an improved means of controlling the location in the body of a semiconductive magnetic sensor at which the high carrier velocities are obtained in relation to the fixed position of the output probe or contact.

Still a further object of this invention is to provide an improved means for balancing out offset voltages produced by the occurrence of noise and unwanted electrical signals being introduced into the output.

SUMMARY

The foregoing and still other objects of the invention are provided in a preferred embodiment in which an FET structure, developed using ion implanation techniques to construct the carrier channel and having a separate control gate positioned above the channel with feedback provided to control the gate voltage, is described. By controlling the voltage on the gate (in combination with the drain voltage) of the FET, the position of pinch off or depletion in the active channel can be controlled. In addition, since the position of the pinch off or depleted area can be controlled, the location along the channel at which the carrier velocities approach their maximum or saturation value may be accurately controlled. The use of a gate on the field effect device also provides important shielding from unwanted electrical fields and the resulting electrical noise therefrom being introduced into the output signals.

BRIEF DESCRIPTION OF THE DRAWINGS

FIG. 10 is a cross-sectional view of a typical preferred embodiment of the invention.

FIG. 11 is a plot depicting carrier velocity versus lateral electric field for several semiconductive materials.

DETAILED SPECIFICATION

A preferred embodiment of the invention will now be described with reference to the technology of silicon substrate field effect transistor devices in general, but it should be clearly understood that the use of any particular semiconducting material would suffice provided that the saturation or nearly saturated velocities of the carriers is achieved in the final structure.

Figure 1:
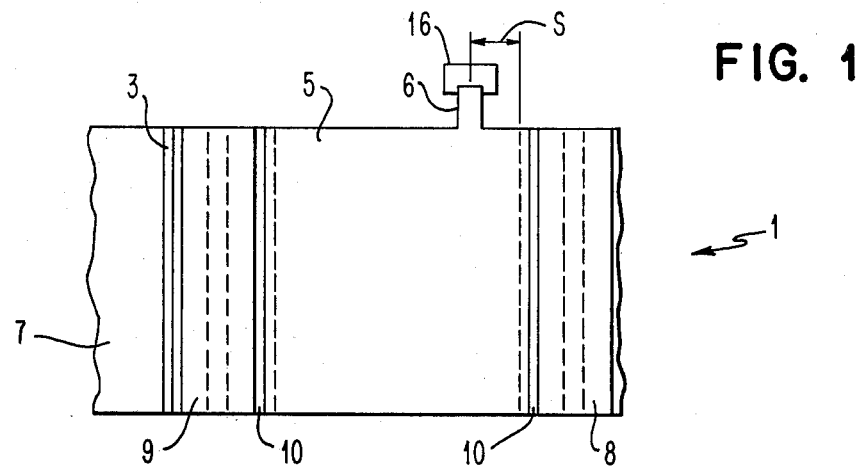
FIG. 1 illustrates a plan view of an FET structure of the preferred embodiment of the invention.

Turning to FIG. 1, a top or plan view of a preferred embodiment of the invention is shown. In FIG. 1, the overall sensor 1 is shown as having source and drain diffusions 2 and 3, respectively. These diffusions provide ohmic contact to the channel lying within the main body of the FET device generally lying in the region 4. A shield electrode 5 is positioned completely over the body 4 and probe portion 6 and serves as a control electrode or gate for the FET device. An output probe 6, which is a portion of the main channel in the device, is shown projecting laterally from the main body 4 at a position generally identified as distance S from the source diffusion 2.

The entire sensor 1 is integrated with, and is part of, a main body of silicon substrate material 7 as will be described in some detail below. For the purpose of integrating this sensor 1 with an amplifier and with associated pulse shaping circuitry, it is most desirable to utilize the same substrate bias voltage required by the integrated amplifier which will be described. The substrate bias is needed to isolate the diffusion regions 2, 3, etc. electrically from one another and from any other diffusion regions within the integrated circuit chip. The electric field produced within the substrate material by the bias voltage also produces several other effects on the operation of the device as will be described later.

Figure 2:
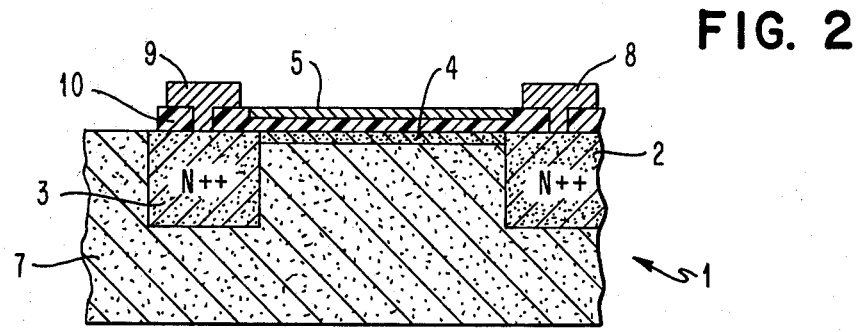
FIG. 2 illustrates a transverse sectional view through the device illustrated in FIG. 1.

Turning to FIG. 2, a transverse sectional view taken through the device illustrated in FIG. 1 is shown. In FIG. 2, it may be seen that the diffusions 2 and 3 which form the source and drain (respectively) for the FET device are formed within the main body 7 of the substrate. The active channel 4 in which conduction will occur and carrier velocity is to be controlled for the purpose of producing an output voltage on the probe 6 shown in FIG. 1, will be described. The shield or gate electrode 5 forms the topmost layer above and insulated from the area of the active channel 4 in the device by insulation oxide layer 10. The thickness of this insulation layer is typically 700A. Ohmic metallized contacts 8 and 9 are provided for the source and drain diffusions, respectively. The metallized contacts 8 and 9 pass through an insulator of $SiO_2$ to contact the surfaces of the diffusion areas 2 and 3, respectively.

The structure illustrated in FIGS. 1 and 2, is manufactured using a standard process in the art of semiconductor construction known as ionic implantation or ion implantation. Ion implantation is used in the preferred embodiment primarily because of the very small physical size of the structure to be described, the desire to obtain a depletion mode device and also because it provides a fine degree of control over the resulting resistance in the active channel. The preferred embodiment shown in FIG. 2 has a substrate material 7 which is intrinsic silcon doped to an approximate density of $5 \times 10^{15}$ boron atoms per cubic centimeter. This doping level will produce a wafer resistivity on the order of 2-ohm centimeters and, although other resistivities can be utilized, this is the preferred range of resistivity for the high carrier velocity sensors as described. Initially, the surface of the 2 ohm-centimeter wafer is provided with an initial oxide layer of $SiO_2$ having a thickness of approximately 5400A units ± 300A units. As is typically the case in the art of FET manufacture, a photographic emulsion of a preferred type will be applied over the $SiO_2$ layer and appropriate exposure to the desired pattern or art work will be made followed by development and removal of the photographic emulsion in the areas where physical action is to be taken. The physical action to be taken is etching by the use of acids to remove the $SiO_2$ layer in the desired locations. In the present instance, the drain and source locations and sizes and the output contact diffusion will be etched through the oxide layer and following this, an over layer of phosphorous will be deposited over the wafer. The phosphorous provides the donor and acceptor atoms for creating the source, output and drain diffusion contacts 2, 16 and 3, respectively. The phosphorous is caused to permeate the substrate 7 by raising the substrate to a high temperature so that a diffusion depth of approximately 2 microns is formed for the source, output contact and drain diffusion regions, 2, 16, and 3, respectively. Then a new oxide layer is grown, although this may occur simultaneously with the phosphorous permeation step. Another photographic emulsion is laid down with appropriate exposure for new art work, etc. to construct the layout for contact holes to provide contacts to the source, output contact and drain diffusion regions as well as for opening up an area for the active channel 4, in preparation for subsequent ion implantation.

Figure 5:
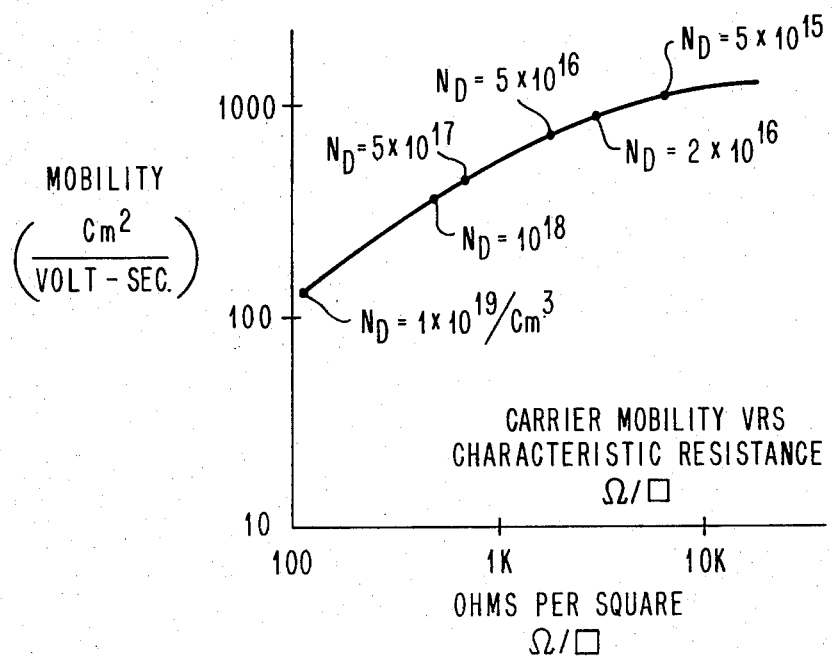
FIG. 5 is a curve representing the relationship between impurity concentration, carrier mobility and resistance in ohms per square for a semiconductive device.

Phosphorous ions are implanted in the preferred embodiment using an implantation energy of 150kev at a concentration of approximately $2 \times 10^{12}$ atoms per square centimeter dose rate. This will result in a penetration of approximately 5000A units of the ions into the surface of the area on the substrate identified for the channel 4. The resulting concentration of donor atoms per cubic centimeter is generally in the range of $4 \times 10^{16}$ donor atoms per cubic centimeter. This produces a resistance in ohms per square of the implanted channel area 4 which exceeds 1,000 ohms per square as may be seen in the graph of FIG. 5, which illustrates the relationship between impurity concentration in donors per cubic centimeter on resistance in ohms per square for a semiconductive device of given thickness. It is desired that a resistance of at least 500 ohms per square be obtained for reasons which will appear further below.

Following the construction of the ion implanted channel 4, an approximately 700A thick SiO$_2$ gate oxide layer will be formed followed by another emulsion and etch process which reopens holes for the source, output contact and drain diffusion contact areas. Finally, aluminum contacts illustrated as contacts 8, 16 and 9 and the control gate 5 will be laid down over the remaining SiO$_2$ illustrated as 10 in FIG. 2, thus completing the formation of the active sensor with its associated source 2, drain 3, control gate 5, active channel 4 and output probe 6 and output contact 16. It is important that the output probe 6 be a part of the same material which is ion implanted in forming the channel 4, for reasons which will appear below, and that the probe 6 extend outward laterally away from the main body of the channel for some distance, creating a general "T" shaped channel and probe configuration.

Figure 3:
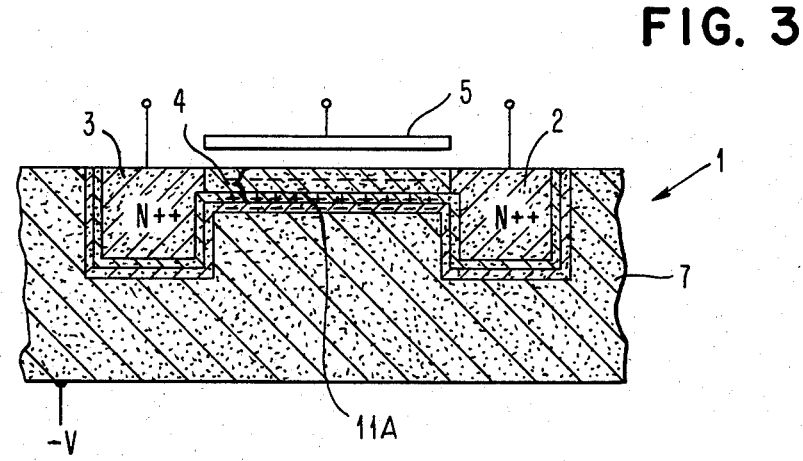
FIG. 3 is a schematic view detailing some of the operation of the structure as shown in FIGS. 1 and 2.

Turning to FIG. 3, a schematic representation in which the insulator oxide layers have been removed for the sake of clarity is shown.

FIG. 3 is a schematic representation substantially like that of FIG. 2. A substrate bias voltage identified as $-V_s$ is shown applied to the substrate 7 in FIG. 3. This voltage produces an electrical field in the body of the substrate 7 which modifies the depletion layer formed in the implanted sensor channel 4 and in probe 6. The depletion layer is an area in the channel where the number of available carriers has been diminished or actually reduced to zero so that there remain in the crystal lattice of the material no available free or conduction electrons or holes. The situation at which both the source and drain electrodes 2 and 3, respectively, are connected to ground potential is shown in FIG. 3 where a depletion layer 11A is illustrated immediately beneath the undepleted area of the channel 4. The depletion area of the implanted channel, for sake of clarity, has been shown with a number of plus signs evenly distributed in it, while above this layer the undepleted area of the channel 4 which still has available carriers in its lattice is shown appropriately with minus signs.

For the condition when both the source and the drain electrodes 2 and 3 are at ground potential, the depletion layer 11A is of uniform thickness and, in effect, uniformly diminishes the thickness of the implanted conduction channel 4 which connects the source 2 to the drain 3. The depleted layer 11A has a depth which is proportional to the square root of the bias voltage applied to the substrate 7. If a voltage is applied to the gate 5 under these circumstances, the thickness of the depleted conduction channel can be modulated. For a positive gate voltage, the channel depth will be increased. For a negative gate voltage, the channel will be further depleted as is illustrated in FIG. 3 by the depleted area illustrated with plus signs positioned below the remaining conductive area of the channel 4 which has the minus signs depicted on it. As is understood by those who are skilled in the art, if the gate voltage is made sufficiently negative, a value corresponding to the threshold voltage, the normal mode of conduction within the channel 4 will be completely cut off due to the total depletion of mobile areas within the channel 4.

Figure 4:
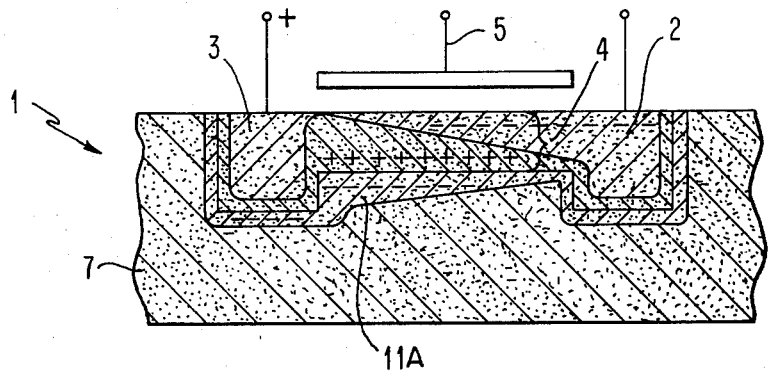
FIG. 4 is a schematic representation of the mode of operation of the device shown in FIGS. 1 through 3.

If a positive voltage is applied to the drain electrode 3, for example, the depletion layer depth in the vicinity of the drain will be diminished and there will result a tapered channel when viewed in vertical cross-section which is illustrated in FIG. 4.

As the drain voltage in FIG. 4 is increased, the thickness of the depleted region of channel 4 in the vicinity of the drain diffusion 3 will increase. If the drain voltage is increased sufficiently, a pinched off condition will result in which, in the vicinity of the drain, there no longer exist normal conduction mode free electrons or carriers, only those injected into that region from the source side of the channel. Under such conditions, the pinched off region of the channel 4 will have a resistance which becomes quite high. If the drain voltage applied to the diffusion 3 is increased for a given gate voltage, the length of the pinched off region of channel 4 can be increased, which will have the effect of moving the total amount of pinched off portion of channel 4 to the right as shown in FIG. 10. This has an important effect on the operation of the sensor. Assuming, for a moment, that the probe 6 (not shown) is near the center of channel 4 and located midway between the source and drain diffusions 2 and 3, respectively, the position of the pinched off portion of channel 4 relative to the location of the probe 6 can be altered by changing the drain voltage or the gate voltage or the substrate voltage, or all of them, as well as the source voltage applied to the source diffusion 2.

The overall operation of the conductive channel between the source and drain diffusions may be analogized to a variable resistance wherein the probe 6 represents a tap on the resistor formed in the body or channel 4.

Figure 6:
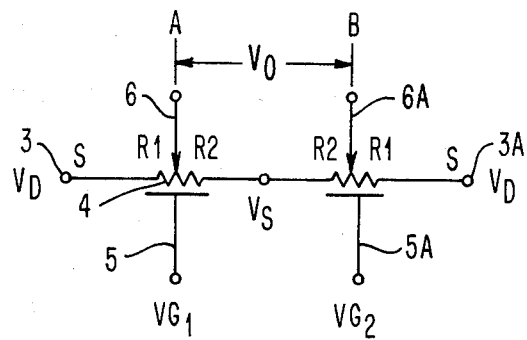
FIG. 6 is an electrical schematic of an equivalent circuit model for an FET pair constructed and operated according to the invention.

Turning to FIG. 6 the situation is illustrated schematically where the semiconductive channel 4 is represented as being comprised of resistors R$_1$ and R$_2$ which have a tap representing probe 6. R$_1$ and R$_2$ are connected to drain and source voltages of V$_d$ and V$_s$, respectively. A control gate 5 having an appropriate gate voltage V$_g$ is also shown.

In FIG. 6, as the drain voltage is increased, the current flowing between the drain and the source will eventually saturate and remain constant. The tapered depletion layer described in FIG. 4 is essential in the operation of this device since the tapered depletion layer provides a vehicle to achieve a nonlinear channel resistance between the drain and source. The output probe 6 which is, as noted above, part of the channel 4 but which extends out from the main body of the channel 4 to form a "T" shape, is shown positioned at a distance S from the drain diffusion 3 and in effect, this probe 6 acts as a tap on the channel resistance 4. Resistance R$_2$ is the channel resistance between the source 2 and the tap 6. Resistance R$_1$ is the channel resistance between the drain 3 and the tap 6. In order to use gate electrode 5 as a means to balance the output from tap 6, it is necessary that $$\frac{1}{R_1} \frac{\delta R_1}{\delta V_g} < \frac{1}{R_2} \frac{\delta R_2}{\delta V_g}.$$

This condition can be satisfied as a result of the tapered depletion layer illustrated in FIG. 4. The resistor R$_1$ is formed in the highly depleted region of the channel and the resistor R$_2$ lies along the not fully depleted remaining portion of the channel.

The relative degree of depletion in resistor R1 and R2 and the position of the more depleted area with respect to probe 6 can thus be controlled as described earlier.

The proportion of depleted channel on one side of probe 6 relative to the proportion of depleted channel on the other side of probe 6 between the source and drain can be varied and the resulting resistances of $R_1$ and $R_2$ shown in FIG. 6 can thus be controlled. It has been found that relatively shallow implants for constructing channel 4 lead to the best balancing configurations and in the preferred embodiment, an implantation depth of approximately 5,000A units or less is utilized.

In order to achieve high carrier velocity in the channel 4, a critical lateral field of at least 500 volts per centimeter must be induced across the channel 4 prior to the time that a completely pinched off condition occurs on the drain side of the channel. Pinch off begins in the channel adjacent to the drain diffusion contact 3 as noted above.

Figure 7:
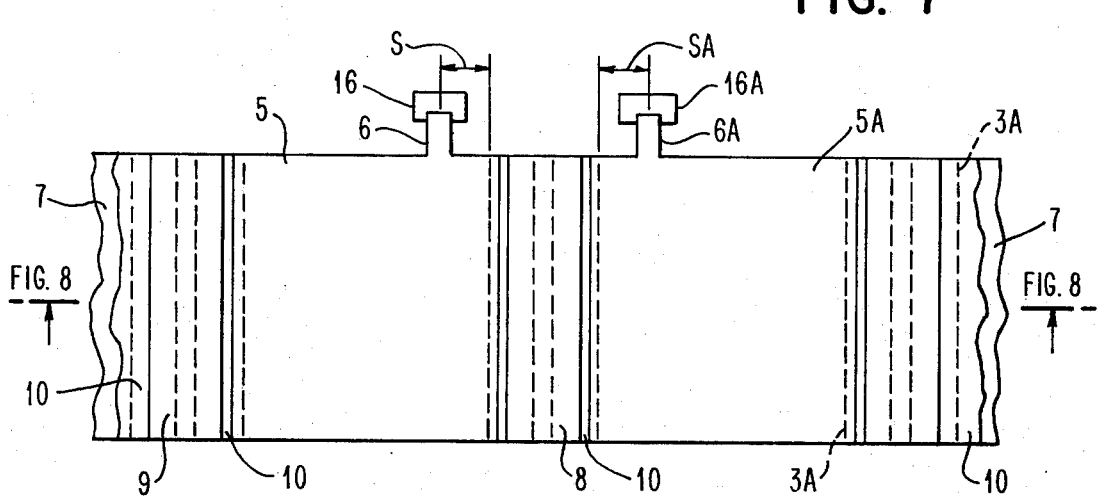
FIG. 7 is an electrical schematic for two sensors joined together and is similar to FIG. 6, but for the two sensors being joined.

FIG. 7 illustrates another embodiment similar to that shown in FIG. 1, but in which two separate sensors are joined together at a common source diffusion 2 on the same common substrate 7. Similar numerals refer to the same elements as illustrated in FIG. 1, but the suffix A has been added to identify the fact that a separate sensor shared in common on the same substrate is described.

Figure 8:
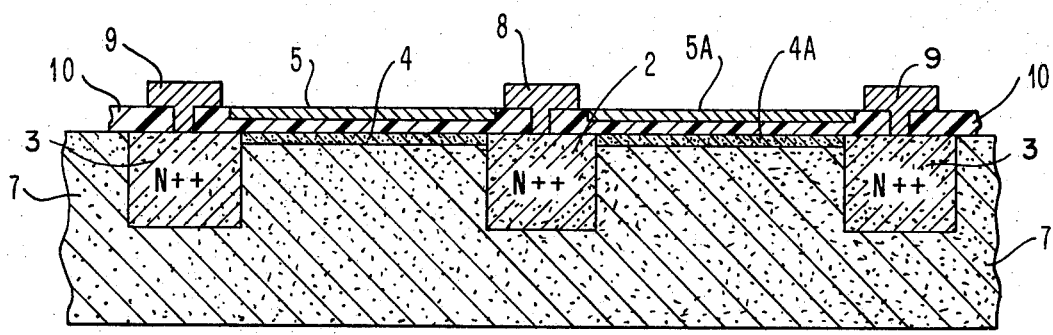
FIG. 8 is similar to FIG. 2 and shows a cross-sectional view of the structure of a device built to operate as the schematic diagram of FIG. 7 shows.
Figure 9:
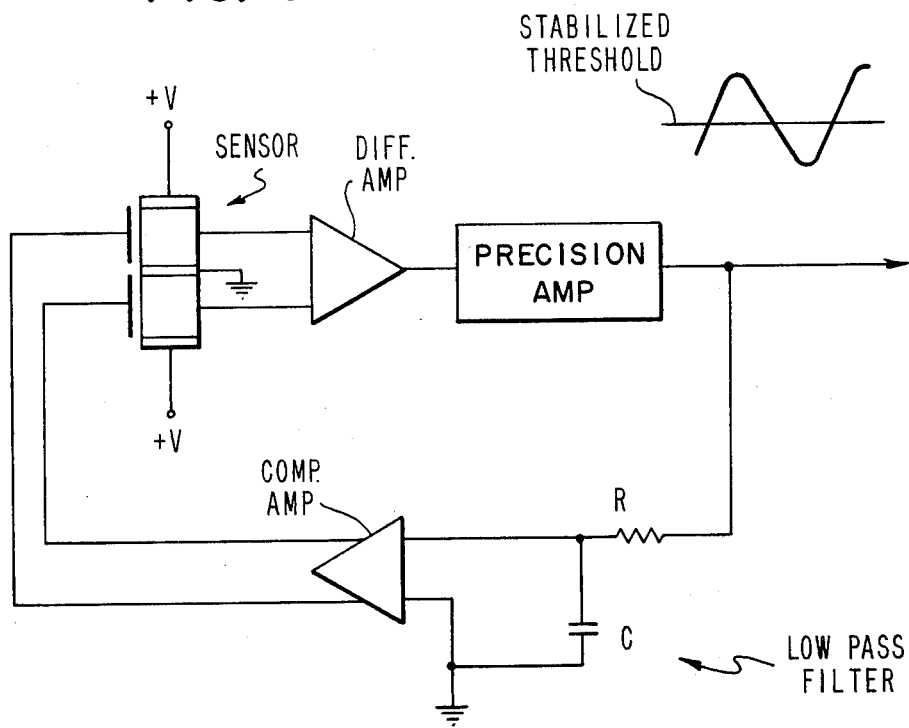
FIG. 9 is a schematic diagram of a sensor circuit with feedback and amplification built to operate a device pair such as shown in FIG. 8.

FIG. 8 is similar to FIG. 2 and, again, suffix A has been added since this is a cross-sectional view of the structure in FIG. 7 where two sensors are shared in common on the same substrate. For such a device, a Hall response signal or output is measured between the terminals 6 and 6A. The situation is illustrated in FIG. 9 in a schematic diagram where the output voltage $V_0$ is measured between the probe 6 and 6A. The gate voltages $Vg_1$ and $Vg_2$ are used in differential mode to balance out undesired DC offset voltages that normally appear between the electrodes as a result of slight variations between the left and right halves of the overall sensor produced by physical variations during manufacture. This DC unbalanced voltage is nulled out by using a closed loop feedback amplifier in the preferred embodiment.

The theory of operation of the device and a more detailed description of the preferred embodiment will now be undertaken. Turning to FIG. 10, a cross-sectional view of a typical example of a preferred embodiment of the present high carrier velocity magnetic sensor field effect device is shown. A substrate of semiconductive material, 7, is normally provided with source drain diffusions of opposite conductivity material to that in the substrate. The source and drain diffusions are numbered 8A and 9A, respectively. An oxide layer 10 overlies substrate 7 and is provided with apertures through which metallized contacts 11 and 12 pass to make ohmic contact with the diffusions 8A and 9A, respectively. Over the central area of the channel 14 between the source and drain is a metallized control gate electrode 13 provided with a supply voltage $V_g$ to control or modify the depth of an inversion layer formed within the conductive channel between the source and drain, thereby to vary the current and/or the number of carriers passing through the channel of the device.

The channel 14 is illustrated schematically in FIG. 10 as a band of ion implanted material having an excess number of conduction carriers in the region extending continuously between the source and the drain, 8A and 9A, respectively. The channel has a length L as depicted.

In operating the device in FIG. 10, suitable voltages are applied to the source and drain are labeled $V_s$ and $V_d$, respectively. As the voltage difference between the source and drain $V_{ds}$ is increased, the flow of current through the channel along length L will increase in general, as illustrated schematically in FIG. 12 where the drain current plotted on the ordinate versus the voltage differential between the source and the drain $V_{ds}$.

As the voltage potential between source and drain increases, there will eventually be reached a condition in which the area in the vicinity of drain 9A becomes depleted of free or mobile carriers and a depletion region having a length $L_d$ as depicted in FIG. 10 will be formed. The depleted region tapers off in the direction of the source diffusion 8A and leaves a relatively undepleted length in the channel equal to $L-L_d$ as shown in FIG. 10. The front of the depleted zone moves to the right in FIG. 10 with increasing voltage differential between source and drain. Near the top of the channel 14 in FIG. 10 a narrow tapered band of undepleted material remains. The material to the left of this point, being fully depleted, is often referred to as "pinched off" since the depth of the active channel having any mobile or free carriers at this point is zero and is, in effect, pinched off. Conduction carriers passing through this region are those which are injected into the depleted part of the channel from the source side of the channel. The gate voltage $\overline{V}_g$ applied to the gate metal area 13 which overlies all of the channel and probe portion, not shown in FIG. 10, can be adjusted to vary the location of the totally pinched off portion of the channel slightly which is useful in balancing the output voltage of the device against a reference or base voltage or against the output voltage of another device on the same substrate 7.

The operation of the device in FIG. 10, when an area has become partially depleted as illustrated, is such that the velocity of the injected carriers at or near the beginning of the pinched off region at the juncture between the depleted and the undepleted areas is at or near saturation velocity $V_s$. This effect is illustrated in FIG. 11 where it may be seen that the velocity of carriers in a semi-conductive device is dependent upon the lateral electric field $E_1$ applied to the device or slab of material. As the Lateral Field $E_1$ (which is equal to voltage drop $V_{ds}$ divided by L) increases, the velocity of the carriers increases in a linear fashion for a time and then gradually peaks and holds a constant or saturation velocity value. It has been demonstrated and proved in my copending prior application that the output of a magnetic sensor device of the Hall type reaches the maximum when the carrier velocity in the vicinity of the output probe reaches a maximum.

Figure 12:
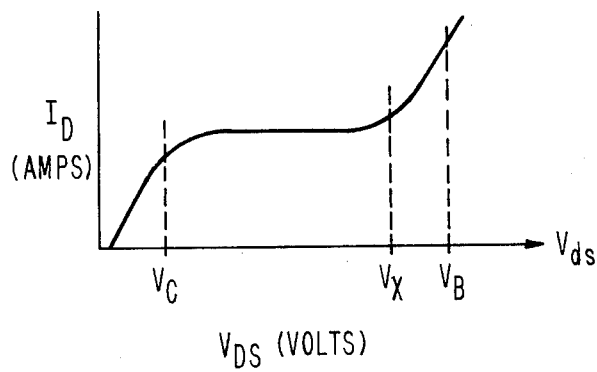
FIG. 12 is a plot of drain current versus source to drain voltage given grounded gates for a device such as shown in FIG. 2, for example.

Turning to FIG. 12, a further analysis of the operation of the device is given. In FIG. 12, the drain current $I_D$ is plotted versus the voltage between the source and drain $V_{ds}$. As may be seen, the drain current initially increases in a linear fashion until a voltage $V_c$ for the source to drain potential is reached, at which point there is a saturation region developed in which there is no appreciable increase, and there may even be a slight decrease in drain current with increasing voltage. Eventually a point is reached at which increasing voltage will cause a rapid increase in drain current followed soon after by breakdown or burn out of the device at a voltage identified as $V_B$ in FIG. 12. Between the point where the saturation region ends, (at a point identified by voltage $V_x$) and the breakdown area voltage, (identified as $V_B$) there exists a third region of operation of a semiconductor device which I have identified as the triode extension region because the operation of the device in this area is similar in characteristic to that of an ordinary vacuum tube triode. The equations which I use to define the operation of a semiconductive device throughout these regions are given below.

LINEAR REGION

Eq. (1)

$$I_D = C_o\hat{\mu}\left(\frac{W}{L}\right)\left[V_D\left(\frac{1+\rho}{\phi}\right)V_s' - \frac{V_D^2}{2}\left(\frac{1+\rho}{\phi}\right)^2\right]\left[\frac{V_o}{V_o - \gamma V_I\left(\frac{V_D}{V_A}\right)}\right]$$

$$0 \leq V_D \leq V_s'\left(\frac{\phi}{1+\rho}\right)$$

LINEAR SATURATION REGION

Eq. (2)

$$I_D = C_o\frac{\hat{\mu}}{2}\left(\frac{W}{L}\right)(V_s')^2\left[\frac{V_o}{V_o - \gamma V_I\left(\frac{V_D}{V_A}\right)}\right]$$

$$\phi\frac{V_s'}{1+\rho} < V_D \leq V_A$$

TRIODE EXTENSION REGION

Eq. (3)

$$I_D = C_o\frac{\hat{\mu}}{2}\left(\frac{W}{L}\right)(V_s')^2\left[\frac{V_o}{[V_o - \gamma V_I(\frac{V_D}{V_A})]e^{-(\frac{V_D - V_A}{\sqrt{2V_I}})^2}}\right]$$

$$V_A < V_D \leq V_{DB}$$

In the Equations the variables are identified as follows where:

$V_s' = V_{gs} - V_T$
$V_{gs} = $ Gate to source voltage
$V_T = $ Threshold voltage $$\rho = \frac{V_s'}{V_s' + V_o}$$

$$V_o = \frac{\sqrt{2}\ V_I L}{\phi\mu_o}$$

$V_D = $ Drain to source voltage
$V_A = V_I + V_s'\phi/1+\rho$
$V_I = V_{IO}\phi$
$V_{IO} = $ Depletion layer ionization threshold voltage, $$\hat{\mu} = \mu_o\sqrt{\frac{V_I}{V_I + .707\ \hat{V}}}\left[\frac{1}{\sqrt{1 + (\frac{.707\hat{V}}{V_o})^2}}\right]$$

$$\theta = \frac{V_s'}{V_s' + V_I}$$

$$\phi = \sqrt{\frac{L}{L + .707\ L_{D_o}}}\quad \text{Channel length correction factor}$$

-continued

| | |
|---|---|
| $L_{D_o} = \frac{\gamma_o V_{I_o}\mu_o}{V_s}$ | Length of depletion layer at the onset of the triode extension region |
| $\hat{V} = V_s' + \rho\theta\ V_D$ | |
| $C_o = \frac{\epsilon_{ox}\epsilon_o}{t_{ox}}$ | is the oxide layer capacitance for a semiconductive device of the FET type |
| where: | |
| $t_{ox} = $ | the thickness of the oxide layer in centimeters. |
| $\epsilon_o$ | is the dielectric constant for silicon oxide equal to 8.85 × 10$^{-14}$ F/cm., |
| and | |
| $\epsilon_{ox}$ | is the relative dielectric constant of the oxide layer which, for silicon material, is approximately equal to 4. |

Returning to FIG. 12, it is desired to operate near or above the critical voltage $V_c$ for the source to drain voltage $V_{ds}$ to achieve the high carrier velocity since, at this voltage $V_c$, pinchoff is just beginning in the channel of the device and, as has been detailed earlier, the velocity of the carriers near the pinchoff region attains saturation velocity and leads to the highest possible sensor output for a Hall device.

$V_c$ is defined as equal to $V_g'\Phi/1+\rho$ where $\rho$ is equal to $V_g'/(V_g' + V_o)$ and $V_o$ equals $\overline{V}_s\sqrt{2}$ times $L/\mu_o\Phi$ and $\Phi$ equals the square root of $L/L+L_{do}$.

It may be seen that the lateral electric field $E_l$ required to attain pinchoff and saturation carrier velocity will be equal to $V_c/L_d$ since it is the lateral field in the undepleted portion of the channel $L-L_d$ that produces the high carrier velocity. Therefore, it will be necessary to apply a voltage differential $V_{ds}$ between the source and drain greater than or equal to $V_g'\Phi/(1+\rho)$ in order to attain the initial pinchoff condition and the resulting high carrier velocities.

$V_g'$ is defined as equal to $V_g-V_t$. $V_g$ is the voltage applied to the gate electrode 13 and $V_t$ is the threshold voltage for operation of an FET device and has a negative value for a depletion mode device and positive value for an enhancement mode device as is well known in the art.

Figure 15:
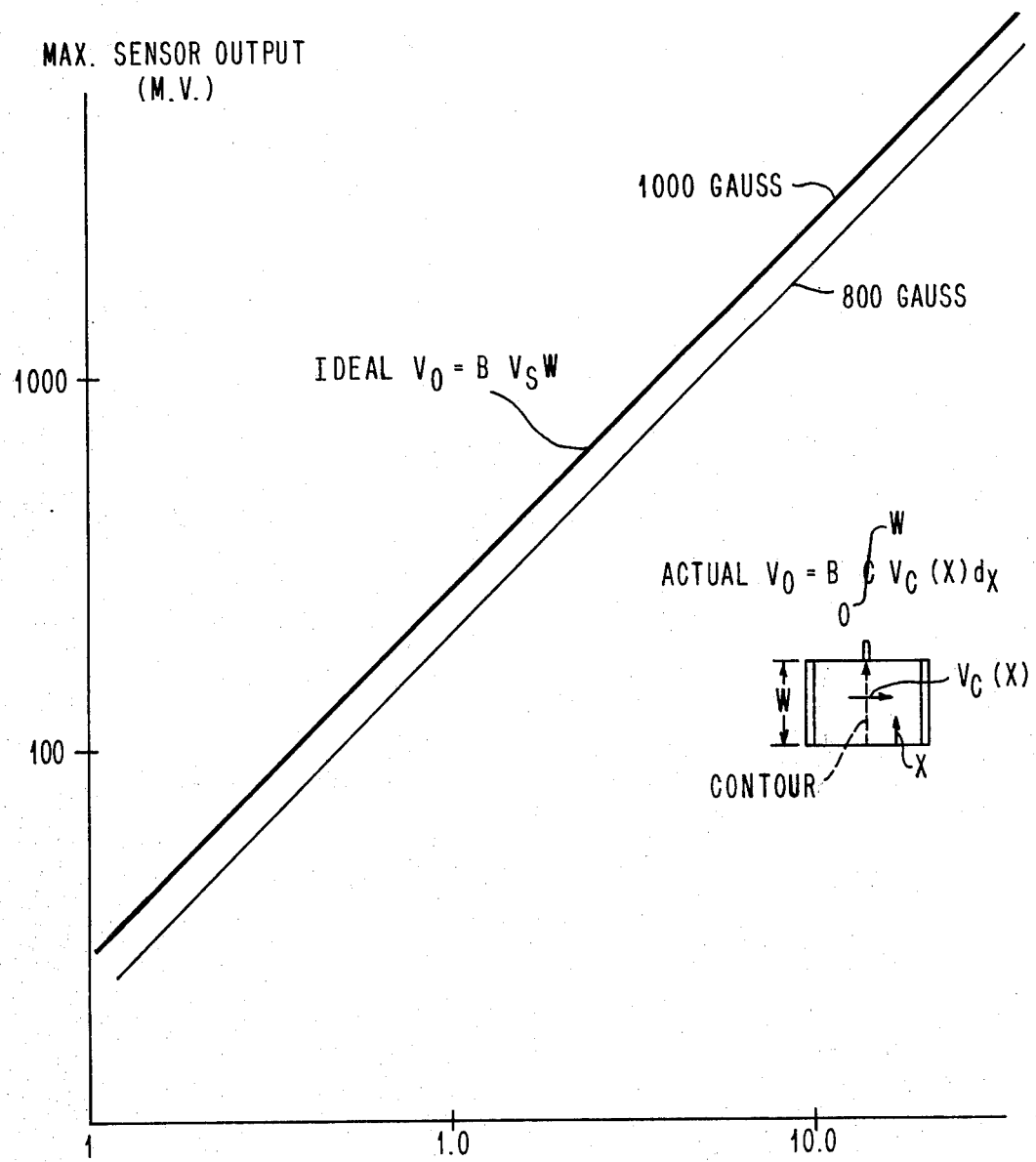
FIG. 15 shows a plot of output voltage versus flux field strength for a device having an aspect ratio equal to 1 and constructed according to the preferred embodiment.

Returning to FIG. 11, the relationship between the lateral electric field and the carrier velocity is depicted. The region where pinchoff is occurring is generally outlined as lying between lateral field values of at least 500 volts per centimeter but less than 100,000 volts per centimeter. The preferred ranges for the embodiment to be discussed are generally in the range of $E_l$ equals $4\times10^3$ volts per centimeter, but at least 1.5 times $10^3$ volts per centimeter, and when the resistance of the channel in ohms per square ($\Omega/\square$) of the channel itself exceeds 1,000. Under such conditions, the sensor output sensed at the probe will be a maximum of 250 millivolts per kilogauss for a channel having an overall dimension of: width equal 0.001 inch, length equal 0.001 inch, and aspect ratio therefore equal to 1.0. In FIG. 15, the maximum output is plotted for devices prepared by the teachings set forth herein for an aspect ratio of 1, given channel width as the independent variable. It is ideally known that the output voltage $V_o$ will equal $B(\overline{V}_s \times W)$, for a Hall cell of width W placed in a magnetic field flux density B and in which the carrier velocity is $\overline{V}_s$. This equation assumes, however, that the distribution of the carrier velocity across the width of the device is a straight line and this is not usually the case. A more appropriate approximation is given by the expression shown in FIG. 15 as the contour integral across the width of the device $$B \oint_0^W V_{d(x)} dx.$$

Figure 13A:
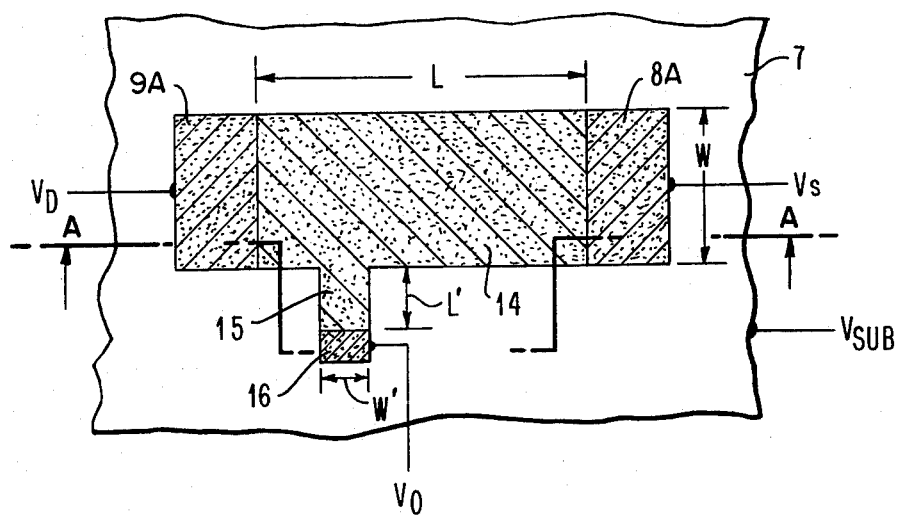
FIG. 13A illustrates a top or plan view of the preferred embodiment.

Turning to FIGS. 13A and B, a top view and an edge view, respectively, of a preferred embodiment of an FET high carrier velocity magnetic sensor is shown.

In FIG. 13A, a top or plan view looking down on a semiconductor device with the metalized regions and overlying insulating oxide layer removed for clarity is shown. It may be seen that there is a substrate 7 provided with source and drain diffusions 8 and 9, respectively, and an intervening "T" shaped channel area 14 having integral therewith a probe portion 15 having an output diffusion 16 at its end as shown. As mentioned previously, it is preferred that the channel and probe be formed by an ion implantation process under a specified set of conditions given above. The typical size in inches of a preferred embodiment would be L equals 0.001 inch, W equals approximately 0.001 inch, L' equals approximately 0.0005 inch and W' equals approximately 0.0001 inch where L, W, L' and W' are as depicted in FIG. 13A, the length and width of the overall channel 14 and the length and width of the integral probe or sensor portion 15 as shown. Suitable voltages $V_s$, $V_d$, and a substrate bias voltage $V_{sub}$ are indicated. A small diffusion region 16 terminates the sensor probe 15 at an output point for the output voltage $V_o$ is provided as shown in FIG. 13A. It will be appreciated that the diffusions for the source and drain and output contact, 8A, 9A and 16 respectively, will all be formed in the same surface but at separate points in the body of the substrate 7.

Figure 13B:
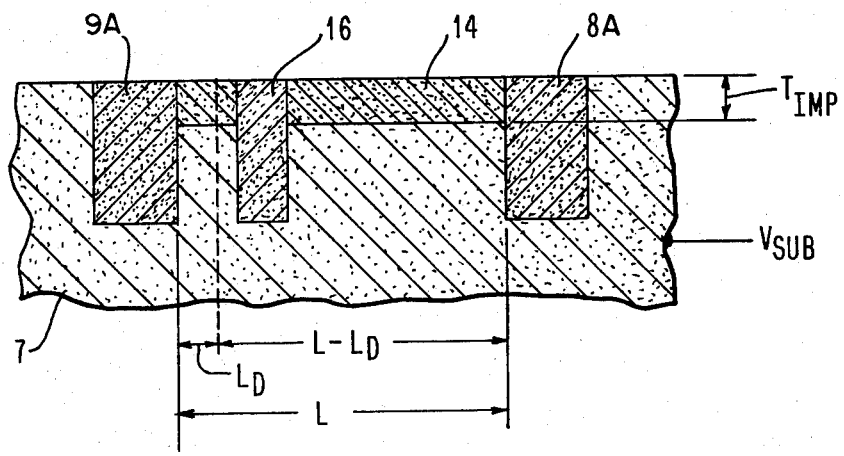
FIG. 13B illustrates an edge view of the preferred embodiment.

FIG. 13B illustrates a cross-sectional edge view taken in the direction A—A of FIG. 13A. In FIG. 13B, the position of the output probe 15 has been illustrated as closer to the drain diffusion 9A than to the source diffusion 8A. It is important that the probe location be adjusted when the device is constructed so that it lies near the point where the depletion zone of length $L_d$ will be formed when a device is energized. This is shown in 13B by the location of the output probe 15 with relation to the juncture between the depleted zone and the undepleted zone. The control electrode for the gate 13 and the insulating oxide layer 10, which have been shown in FIG. 10 previously, are not depicted in FIG. 13B for the sake of clarity, but it will be understood that, by appropriate control of the source and drain voltages and by proper control of the gate voltage $V_g$, the location of the pinchoff area at a distance $L_d$ as depicted in FIG. 13B from the drain 9A can be accurately controlled so that the sensor probe 15 lies at or very close to the depleted region of the device in operation.

Equation 2 above characterizes the operation of the device from the incipiency of pinchoff through the beginning of the triode extension region defined in equation 3. Throughout the range of operation of the device for the equation 2, the pinchoff zone will be moving to the right with increasing source to drain voltages and/or increasing gate voltage.

Figure 14A:
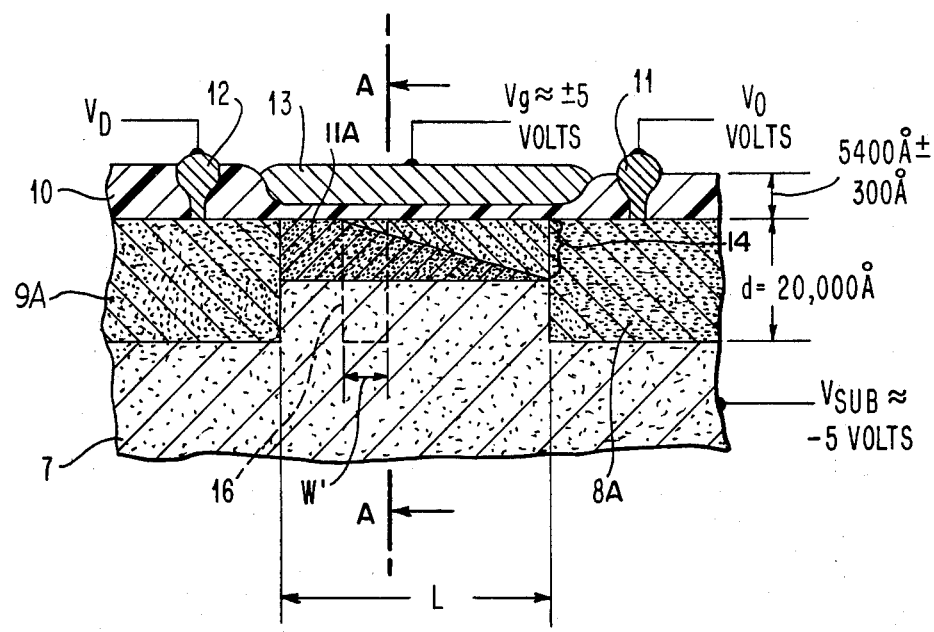
FIG. 14A illustrates a longitudinal cross-section of an FET device of the preferred type.
Figure 14B:
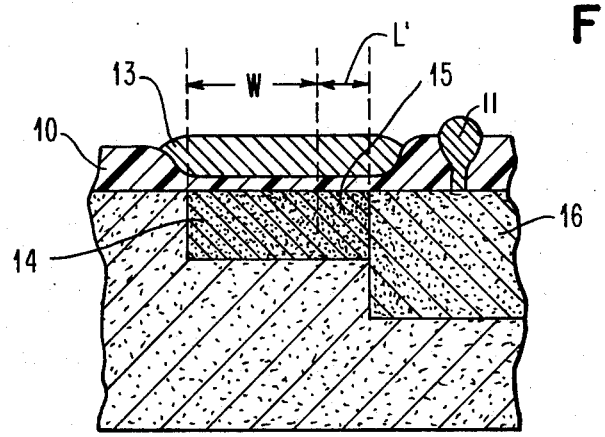
FIG. 14B illustrates a plan view of the device in FIG. 14A.

Turning to FIGS. 14A and B, more detailed drawings of the preferred embodiment are illustrated.

In FIG. 14A, a longitudinal cross section of an FET device of a preferred sort is shown where the section has been taken passing through the region of the junction between the main body of the channel and its extension probe portion 15.

Substrate 7 is provided with source and drain diffusions and an output contact diffusion. These are 8A, 9A and 16 respectively.

Oxide layer 10 is thicker in the region outside of the main channel length L and is on the order of 5400A ± 300A; for example, in the regions to the right and left, respectively, of the source and drains 8A and 9A respectively. In the intervening area along the length of the channel L, the oxide layer is preferably thin, on the order of 600A in order to provide highly sensitive response to applied gate voltages applied to the gate metal 13. Typically, a device such as shown in FIG. 14A would be operated with a gate voltage plus or minus 5 volts and centered somewhere about the supply voltage typically chosen so that the supply voltage is ground. The substrate will be provided with a substrate bias voltage in order to electrically isolate the various diffusion regions on the substrate. The bias is generally on the order of a negative five volts. Then the drain voltage $V_d$ will be adjusted appropriately to create the necessary lateral field across the channel. This field is built up primarily through the undepleted region $L-L_d$ as described previously with relation to FIGS. 10A and 10B and 13A and 13B.

It will be observed that the output probe 15 is located along the channel length L at a position S measured from the source diffusion, and in the channel near where the highest carrier velocities will be obtained at the beginning of pinchoff. The output probe is located at, or very close to, the termination of the depletion layer length at its juncture with the undepleted portion of the channel. It is most appropriate that the high lateral fields required to inject the carriers at the saturation carrier velocity be generated across the undepleted portion of the channel having a length $L-L_D$. The overall operation of the device is fully characterized by my equations 1, 2 and 3 given above, and it is only necessary to choose the appropriate operating voltages for a given device to cause it to operate within the Linear Saturation Region specified in equation 2 or the Triode Extension Region specified by Equation 3.

While the invention has been particularly shown and described with reference to a preferred embodiment thereof, it will be understood by those skilled in the art that various changes in form and details may be made therein without departing from the spirit and scope of the invention.

What is claimed is:

1. A magnetically sensitive field effect transistor structure, comprising:
   a substrate of one conductivity type semiconductive material, said substrate having first, second, and third spaced apart contact diffusion regions of opposite conductivity type material to said substrate and defining, respectively, source, drain and output contact diffusion regions in a field effect device on the surface of said substrate;

said source and drain diffusions being separated from one another by a distance L;

a controllable conductance region forming a conduction channel of a field effect device located in the surface of said substrate and connecting said source and drain diffusions;

said channel having integral therewith a signal output probe of channel material itself comprising a lateral projection of said channel generally perpendicular to said length L, said projection lying in the plane of said channel and thereby defining a T-shaped channel and integral probe combination in the surface of said substrate;

said output probe being terminated by said third or output contact diffusion region;

an insulating layer overlying said surface of said substrate, said layer having means therein for enabling electrical contact to be made from above said layer to said source, drain and output contact diffusion regions, respectively; and, conductive control gate means for controlling the conductance of said channel in said device, said control gate means overlying said insulating layer in an area coextensive with said T-shaped channel and probe combination in the surface of said substrate.

2. A field effect transistor structure as defined in claim 1, wherein:

said output probe extends outward perpendicularly from said length L of said channel by a distance L' and has a width W' parallel to the length of said channel L, L' and W' being such that L'/W' is greater than or equal to 1.

3. A field effect transistor structure as defined in claim 2, wherein:

L'/W' is in the range of greater than or equal to 1 but less or equal to 10.

4. A high carrier velocity field effect transistor apparatus for sensing magnetic fields, comprising:

a substrate of one conductivity type semiconductive material, said substrate having first, second, and third spaced apart contact diffusion regions of opposite conductivity type material to said substrate and defining, respectively, source, drain and output contact diffusion regions in a field effect device on the surface of said substrate;

said source and drain diffusions being separated from one another by a distance L;

a controllable conductance region forming a conduction channel of a field effect device located in the surface of said substrate and connecting said source and drain diffusions;

said channel having integral therewith a signal output probe of channel material itself comprising a lateral projection of said channel generally perpendicular to said length L, said projection lying in the plane of said channel and thereby defining a T-shaped channel and integral probe combination in the surface of said substrate;

said output probe being terminated by said third or output contact diffusion region;

an insulating layer overlying said surface of said substrate, said layer having means therein for enabling electrical contact to be made from above said layer to said source, drain and output contact diffusion regions, respectively; and, conductive control gate means for controlling the conductance of said channel in said device, said control gate means overlying said insulating layer in an area coextensive with said T-shaped channel and probe combination in the surface of said substrate;

means for creating a fully depleted zone in said channel, said zone having a length $L_D$;

and means for creating high carrier velocities in said channel comprising means for generating a longitudinal electric field in said channel along the undepleted length thereof ($L-L_D$) of at least 500 volts per centimeter; and said undepleted portion of said channel having a resistance of at least 500 ohms per square.

5. Apparatus as described in claim 4, wherein:

said output probe extends outward perpendicularly from said length L of said channel by a distance L' and has a width W' parallel to the length of said channel L, L' and W' being such that L'/W' greater than or equal to 1.

6. Apparatus as described in claim 5, wherein:

L'/W' is in the range of greater than or equal to 1 and less than or equal to 10.

7. Apparatus as described in claim 4, wherein:

said resistance of said channel lies in the range of 1000 to 10,000 ohms per square; and, said longitudinal electric field in said channel has a range of from $5 \times 10^3$ volts per centimeter to $1 \times 10^5$ volts per centimeter and is optimum at approximately $2 \times 10^4$ volts per centimeter.

8. Apparatus as described in claim 5, wherein:

said resistance of said channel lies in the range of 1000 to 10,000 ohms per square; and, said longitudinal electric field in said channel has a range of from $5 \times 10^3$ volts per centimeter to $1 \times 10^5$ volts per centimeter and is optimum at approximately $2 \times 10^4$ volts per centimeter.

9. Apparatus as described in claim 6, wherein:

said resistance of said channel lies in the range of 1000 to 10,000 ohms per square; and, said longitudinal electric field in said channel has a range of from $5 \times 10^3$ volts per centimeter to $1 \times 10^5$ volts per centimeter and is optimum at approximately $2 \times 10^4$ volts per centimeter.

* * * * *